United States Patent
Wang et al.

(10) Patent No.: US 7,329,115 B2
(45) Date of Patent: Feb. 12, 2008

(54) PATTERNING NANOLINE ARRAYS WITH SPATIALLY VARYING PITCH

(75) Inventors: Shih-Yuan Wang, Palo Alto, CA (US); M. Saif Islam, Sacramento, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 248 days.

(21) Appl. No.: 11/061,226

(22) Filed: Feb. 18, 2005

(65) Prior Publication Data
US 2006/0186084 A1    Aug. 24, 2006

(51) Int. Cl.
*B29C 59/00* (2006.01)

(52) U.S. Cl. .................. 425/385; 425/404; 156/345.22

(58) Field of Classification Search ............... 425/385, 425/403, 404, 375; 156/655.1, 345.1, 345.22; 216/2, 8; 430/320, 330; 438/700–714
See application file for complete search history.

(56) References Cited

U.S. PATENT DOCUMENTS

| | | | |
|---|---|---|---|
| 6,128,214 A | 10/2000 | Kuekes et al. | |
| 6,256,767 B1 | 7/2001 | Kuekes et al. | |
| 6,314,019 B1 | 11/2001 | Kuekes et al. | |
| 6,407,443 B2 | 6/2002 | Chen et al. | |
| 6,459,095 B1 | 10/2002 | Heath et al. | |
| 6,559,468 B1 | 5/2003 | Kuekes et al. | |
| 6,743,368 B2 * | 6/2004 | Lee | 216/2 |
| 7,022,465 B2 * | 4/2006 | Heidari | 430/320 |
| 7,060,625 B2 * | 6/2006 | Lee | 438/702 |

OTHER PUBLICATIONS

Cockerill, et. al., "Twelve-Channel Strained-Layer . . . By Selective-Area MOCVD," IEEE Photonics Technology, vol. 6, No. 7, pp. 786-788 (Jul. 1994).
Katoh, et. al., "DBR Laser Array for WDM System," Electronics Letters, vol. 29, No. 25, pp. 2195-2197 (Dec. 9, 1993).
Aoki, M., et. al. "Novel Structure MQW . . . by Selective Area MOCVD Growth," Electronics Letters, vol. 27, No. 23, pp. 2138-2140 (Nov. 7, 1991).
Galeuchet, Y.D., et. al., "Selective Area MOVPE . . . and Nonplanar (100) and {111} Substrates," Journal of Crystal Growth, vol. 107, pp. 147-150 (1991).
Ku, P.C., et. al., "Buried Selectively-Oxidized AlGaAs Structures Grown on Nonplanar Substrates," Optics Express vol. 10, No. 19, 6 pp., (Sep. 23, 2002).

\* cited by examiner

*Primary Examiner*—Yogendra N. Gupta
*Assistant Examiner*—Thu Khanh T. Nguyen

(57) ABSTRACT

A nanoimprint mold is described, comprising a plurality of alternating layers of distinct materials differentially etched along an edge thereof, said layers having spatially varying thicknesses along said edge such that nanolines patterned with said nanoimprint mold have corresponding spatially varying pitches.

15 Claims, 5 Drawing Sheets

PATTERNING NANOLINE ARRAYS WITH SPATIALLY VARYING PITCH

FIELD

This patent specification relates to nanoimprint lithography. More particularly, this patent specification relates to patterning nanoline arrays having spatially varying pitch.

BACKGROUND

The fabrication of nanolines of very small widths is important for several emerging device applications. For example, in the molecular electronics field, the banded energy states of single molecules can be electrically manipulated to achieve a variety of discrete nano-scale devices such as non-linear resistors, switches, and transistors, as well as electrically settable, readable, and resettable memory cells. However, to harness the promising potential of such nanoscale devices, it is necessary to provide meaningful electrical access to them from outlying macro-scale and micro-scale environments. For example, in producing an ultra-dense memory device, it would be desirable to produce a large-scale array of metallic nanolines, also termed metallic nanowires, nanotraces, or nanoconduits, having line widths of 10 nm or less. Decreasing the line widths even further can result in even higher memory densities, even down to 1 nm or less in some cases before other factors begin to limit achievable densities.

Due to substantial difficulties with photolithographic methods below about 100 nm, and due to production scalability problems with electron beam lithography methods, one method for achieving scalable device production for line widths below 50 nm is to use electron beam lithography to pattern a nanoimprint mold, and to transfer the imprinted pattern to target production devices according to a nanoimprint lithography process. However, electron beam lithography itself is generally limited to the 20 nm-30 nm range due to feature broadening from secondary electron yields (proximity exposure). Even using a spatial frequency doubling technique to further increase resolution, electron beam lithography is generally limited to the 10 nm-15 nm range.

It would be desirable to produce a dense array of nanolines in a manner that allows for line widths below 10 nm, while also allowing for per-line connectivity to a nearby array of lesser density, thereby facilitating external access to the dense array. More generally, it would be desirable to provide an array of nanolines in a manner that allows for line widths below 10 nm while also allowing for lengthwise-varying pitch.

SUMMARY

In accordance with an embodiment, a nanoimprint mold is provided, comprising a plurality of alternating layers of distinct materials differentially etched along an edge thereof. The layers have spatially varying thicknesses along the edge such that nanolines patterned with the nanoimprint mold have corresponding spatially varying pitches.

Also provided is a method for fabricating a nanoimprint mold, comprising forming a plurality of alternating layers of two different materials having different etch rates for at least one etchant. The plurality of alternating layers are processed to expose a cross-sectional surface thereof. The at least one etchant is applied to the exposed cross-sectional surface to form an etched cross-sectional surface having an indentation pattern resulting from the different etch rates. The nanoimprint mold is derived from the etched cross-sectional surface. The forming of the plurality of alternating layers comprises spatially varying a thickness of at least one of the layers according to a selective area growth process. The cross-sectional surface intersects the at least one layer along a direction of the spatial thickness variation.

Also provided is a method of fabricating a mold, comprising forming a plurality of alternating layers of two materials having different etch rates for at least one etchant, each layer having a spatially varying thickness. The method further comprises exposing an edge of the plurality of alternating layers along a direction of the spatially varying thickness and etching the exposed edge with the at least one etchant.

Also provided is an apparatus comprising an array of nanolines having a first pitch greater than about 30 nm at a first end gradually tapering to a second pitch less than about 20 nm at a second end. The array is fabricated using a nanoimprint mold comprising alternating layers of differentially etched materials.

Also provided is an apparatus for fabricating a nanoimprint lithography mold, comprising means for forming a plurality of alternating layers of two materials having different etch rates for at least one etchant, each layer having a spatially varying thickness. The apparatus further comprises means for exposing an edge of the plurality of alternating layers along a direction of the spatially varying thickness, and means for etching the exposed edge with the at least one etchant.

DETAILED DESCRIPTION

Figure 1:
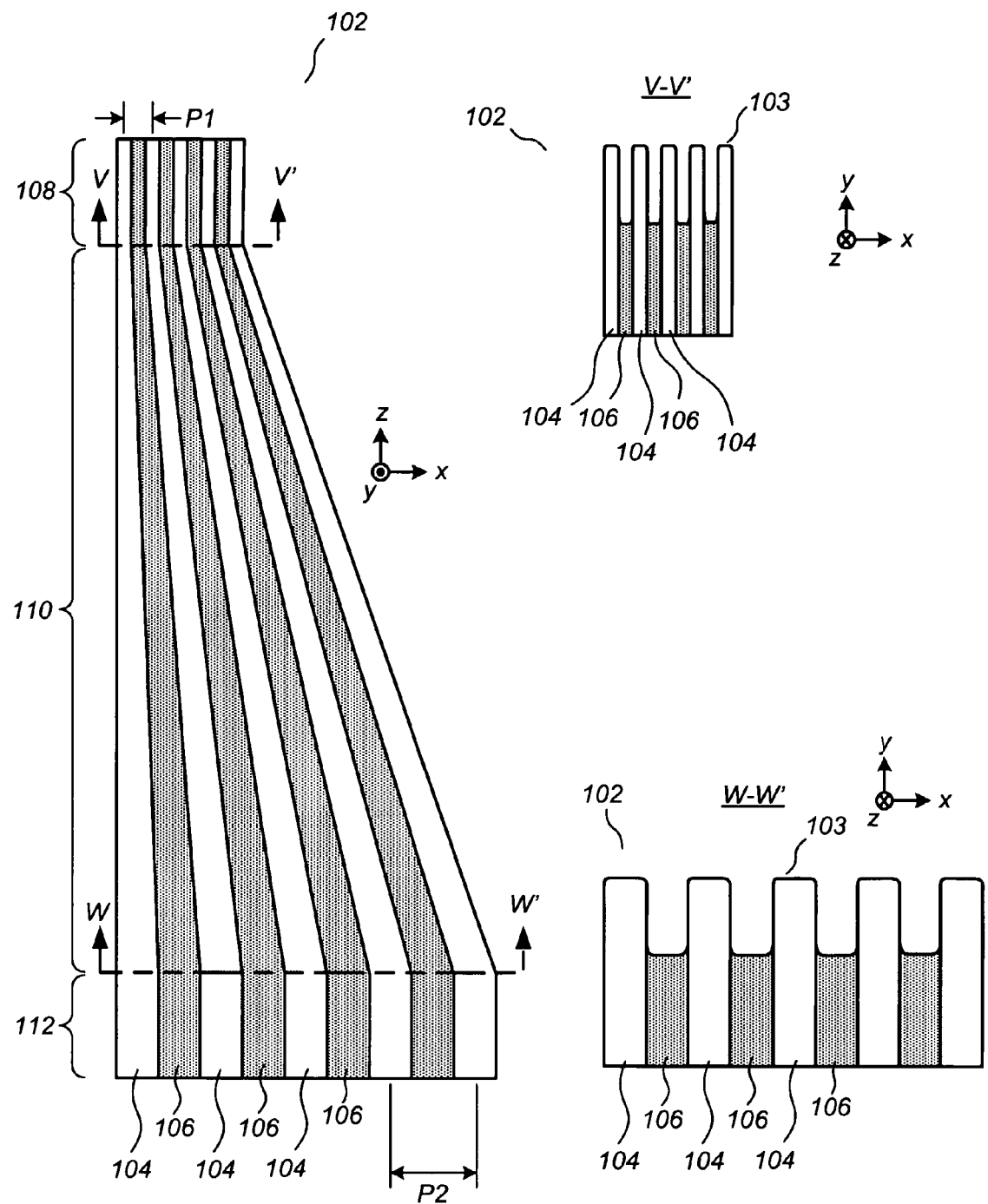
FIG. 1 illustrates a nanoimprint lithography mold according to an embodiment.

FIG. 1 illustrates a nanoimprint lithography mold 102 according to an embodiment. More particularly, FIG. 1 illustrates a bottom view of the mold 102 having exaggerated proportions for clarity of description. As illustrated in FIG. 1 and as used hereinbelow, the x-axis generally corresponds to a line width and pitch dimension of the mold 102, and the z-axis corresponds to a lengthwise dimension of the mold 102, i.e., to a lengthwise dimension of the nanolines to be imprinted by the mold 102. The +y-axis corresponds to a direction of movement of the mold 102 relative to a resist-coated target surface during the imprinting process. For clarity of description, and as will be consistent with the orientation of the mold 102 as it is being fabricated, the "top" surface of the mold 102 refers herein to the surface 103, i.e., the surface that comes into contact with the resist-coated target surface during the imprinting process.

Mold 102 comprises a plurality of alternating layers of distinct materials 104 and 106 that are stacked in a direction corresponding to a width dimension of the nanolines to be imprinted, which is the x-direction in FIG. 1. In one embodiment, the materials 104 and 106 comprise AlGaAs and GaAs, respectively. In other embodiments, the materials 104 and 106 can comprise any material pair capable of being grown according to a selective area growth process and having different etch rates for at least one etchant.

Each pair of material layers 104/106 corresponds to an additional nanoline in the target device. While only a few pairs of material layers 104/106 are illustrated for the mold 102 in FIG. 1, there can generally be hundreds or thousands of such material pairs, in turn yielding hundreds or thousands of nanolines in the target device. In the example of FIG. 1, at any particular point along the length dimension z, all of the layers 104/106 have a uniform thickness. In other embodiments, at any particular point along the length dimension z, the layers 104 may have a first uniform thickness different than a second uniform thickness of the layers 106. In still other embodiments, at any particular point along the length dimension z, the layers 104 and 106 may have non-uniform thicknesses, as dictated by the needs of the particular device to be imprinted.

Mold 102 comprises a narrow section 108, a wide section 112, and a transition section 110 that provides continuous, and usually gradual, per-line connectivity between the narrow section 108 and the wide section 112. For purposes of clarity, certain exemplary applications and dimensions are presented herein, although it is to be appreciated that the scope of the present teachings is not so limited. In one example, the mold 102 may correspond to a target device that is to have 500 metallic nanolines. The narrow section 108 may correspond to the metallic lines of a molecular wire crossbar memory having a pitch P1 of about 4 nm, and therefore an overall width of the narrow section 108 would be about 2 µm. Due to resistance issues at such narrow line widths, the length of the narrow section 108 would usually be limited to about 1-3 µm. The wide section 112 may correspond to metallic lines that eventually lead to the outside "micro" world, and may have a pitch P2 of about 40 nm. In this case, the wide section 112 would have an overall width of about 20 µm. The transition section 110 would widen continuously from 2 µm at its narrow end (see FIG. 1 at V-V') to 20 µm at its wide end (see FIG. 1 at W-W'). By way of example and not by way of limitation, the length of the transition region could be in the range of 1 µm to 10 µm. The particular depth of the imprint lines (i.e., the distance between the tops of layers 106 and layers 104 in FIG. 1) can vary greatly depending on the particular application, ranging from as little as 0.4 nm to several hundred nm.

In other embodiments, the pitch P1 can be between 2-4 nm and the pitch P2 can be 20-40 nm. In still other embodiments, the pitch P1 can be between 1-10 nm and the pitch P2 can be 20-120 nm. More generally, the pitch P1 can be any width that is too small for accommodation by electron beam lithography, while the pitch P2 should be large enough for accommodation by electron beam lithography. In this manner, electron beam lithography can then be used to create additional sets of lines leading from the outside "micro" world to the end of the wide section 112, thereby providing per-line connectivity all the way from the narrow section 108 to the outside "micro" world. The additional lines would be placed in outlying areas of a larger mold surrounding the mold 102 such that they abut the end of the wide section 112. Generally speaking, growth ratios up to about 10:1 can be achieved using known selective area growth methods, which corresponds to width transitions on the order of 10:1 for the mold 102. However, larger width ratios that might be achieved by future selective area growth processes and/or by chaining multiple molds together are not outside the scope of the present teachings.

Figure 2:
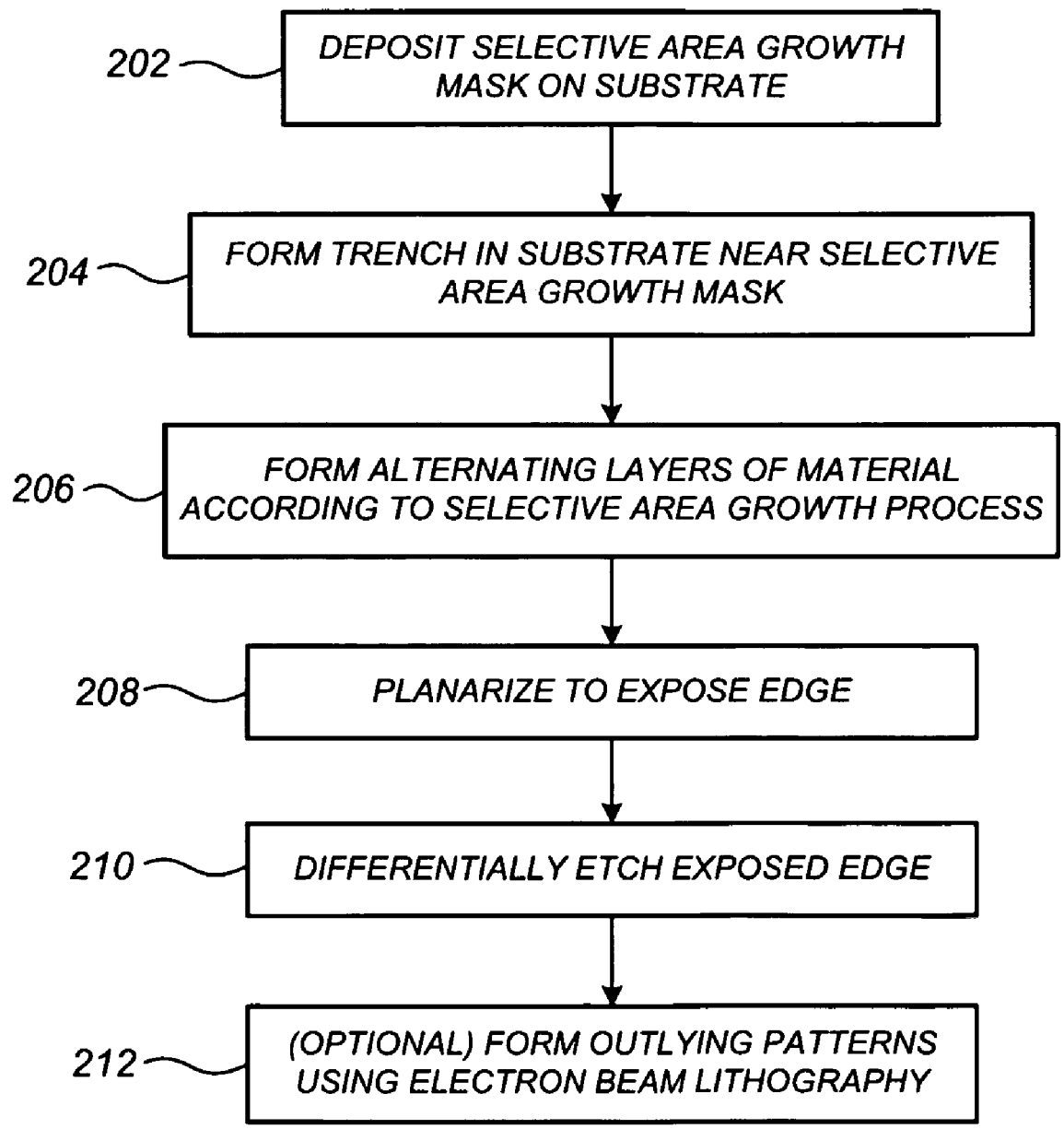
FIG. 2 illustrates fabricating a nanoimprint lithography mold according to an embodiment.

FIG. 2 illustrates fabricating a nanoimprint lithography mold according to an embodiment. At step 202, a selective area growth mask is deposited on a substrate. The selective area growth mask can comprise a dielectric such as $SiO_2$, and can be patterned and deposited on a substrate using any of a variety of known methods. The substrate can comprise Si or any of a variety of III-V materials such as GaAs, InP, and GaN. Because it is generally less fragile than materials such as GaAs, Si is a particularly advantageous substrate choice for imprint lithography applications. In other embodiments, the substrate can comprise sapphire or diamond. At step 204, a trench is formed in the substrate near the selective area growth mask. At step 206, alternating layers of material are formed according to a selective area growth process. At step 208, the collection of alternating layers of material is planarized to expose an edge thereof, the edge corresponding to the top surface 103 in FIG. 1.

At step 210, the exposed edge is differentially etched using an etchant for which the two materials are known to have different etch rates. Differential etching may also be referred to as selective etching. The particular chemical composition of the selective etchant would be readily known by one skilled in the art based on the particular materials used, the particular desired imprint depth, and other desired parameters. By way of example and not by way of limitation, a citric acid/hydrogen peroxide solution may be used as a selective etchant where the layer materials are GaAs and AlGaAs, and the different etch rates can be varied by varying the percentages of the citric acid and hydrogen peroxide components.

Figure 3A:
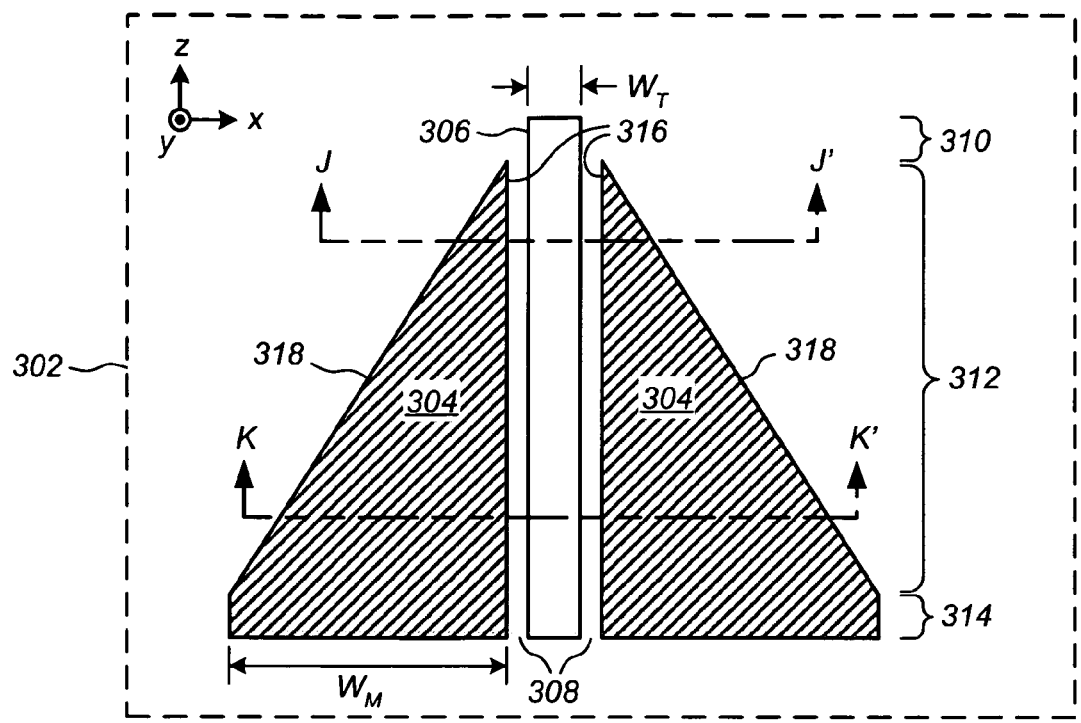
FIG. 3A illustrates a top view of a portion of a wafer during fabrication of a nanoimprint lithography mold according to an embodiment.

FIG. 3A illustrates a top view of a portion 302 of a wafer during fabrication of a nanoimprint lithography mold according to an embodiment. It is to be appreciated that the portion 302, hereinafter simply referred to as substrate 302, can be replicated many times over the dimensions of an overall wafer for en masse device production purposes. The top view of substrate 302 in FIG. 3A corresponds to a point in the mold fabrication process immediately subsequent to the trench formation step 204. With respect to FIG. 3A, the desired mold (more particularly, two mirror copies of desired molds) will be formed along the left side (and right side) of a trench 306, with its imprinting surface (see FIG. 1, surface 103) facing the +y direction. The desired mold will have a narrow section corresponding to an upper section 310 of the trench 306, a transition section corresponding to a middle section 312 of the trench 306, and a wide section corresponding to a lower section 314 of the trench 306.

The trench 306 should have a width $W_T$ that is greater than twice the maximum width dimension of the nanoimprint mold being created, and a depth appreciably greater than the maximum width dimension of the nanoimprint mold being created. By way of example, for the exemplary mold dimensions described supra with respect to FIG. 1 in which the width of the wide section is 20 µm, one appropriate value for width $W_T$ is about 50 µm and one appropriate depth of the trench 306 would be about 30 µm.

The selective area growth mask 304 is generally symmetric around the trench 306 as indicated in FIG. 3A, and comprises inner edges 316 separated from the sides of the trench 306 by nominal gaps 308 which may be, for example, on the order of several hundred nm wide. The nominal gaps 308 provide enough space to accommodate epitaxial growth up and over a corner of the trench, this corner being shown in the cross-sectional views J-J' and K-K' of FIG. 3B. In alternative embodiments, the nominal gaps 308 may be omitted, provided that epitaxial growth of the layers in an outward direction from the side wall of the trench 306 can be reliably achieved near the top of the trench 306.

For the upper section 310 of the trench 306, which corresponds to a narrow section of the desired imprint mold, the selective area growth mask 304 either has a very narrow uniform width or, as in the case of FIG. 3A, is not present at all. For the lower section 314 of the trench 306, which corresponds to a wide section of the desired imprint mold, the selective area growth mask 304 has a width $W_M$ that may be several microns to hundreds of microns, depending on the particular materials and growth conditions. For the middle section 312 of the trench 306, which corresponds to a transition section of the desired imprint mold, the selective area growth mask 304 has a tapering width according to an outer edge 318. In one embodiment, the outer edge 318 has a linear taper, while in other embodiments the outer edge 318 may have a concave, convex, or other nonlinear tapering character. The taper of the outer edge 318 generally controls the thickness profile of the epitaxially grown layers, and is preferably selected such that the layer thickness profile is linear, although the scope of the present teachings is not so limited.

Selective area growth (SAG) refers to a process of forming material layers having localized thicknesses than can be controlled according to a lateral dimension of a mask (termed herein a selective area growth mask) covering an adjacent portion of the substrate. Generally speaking, thinner layers are formed where the selective area growth mask covers a smaller percentage of adjacent substrate, while thicker layers are formed where the selective area growth mask covers a larger percentage of adjacent substrate. As used herein, selective area growth includes, but is not limited to, selective area epitaxy, selective MOCVD growth (SMG), MOCVD selective-area epitaxy, selective area MOVPE, and other analogous processes, where MOCVD refers to metal-organic chemical vapor deposition and MOVPE refers to metalorganic vapor phase epitaxy.

Figure 3B:
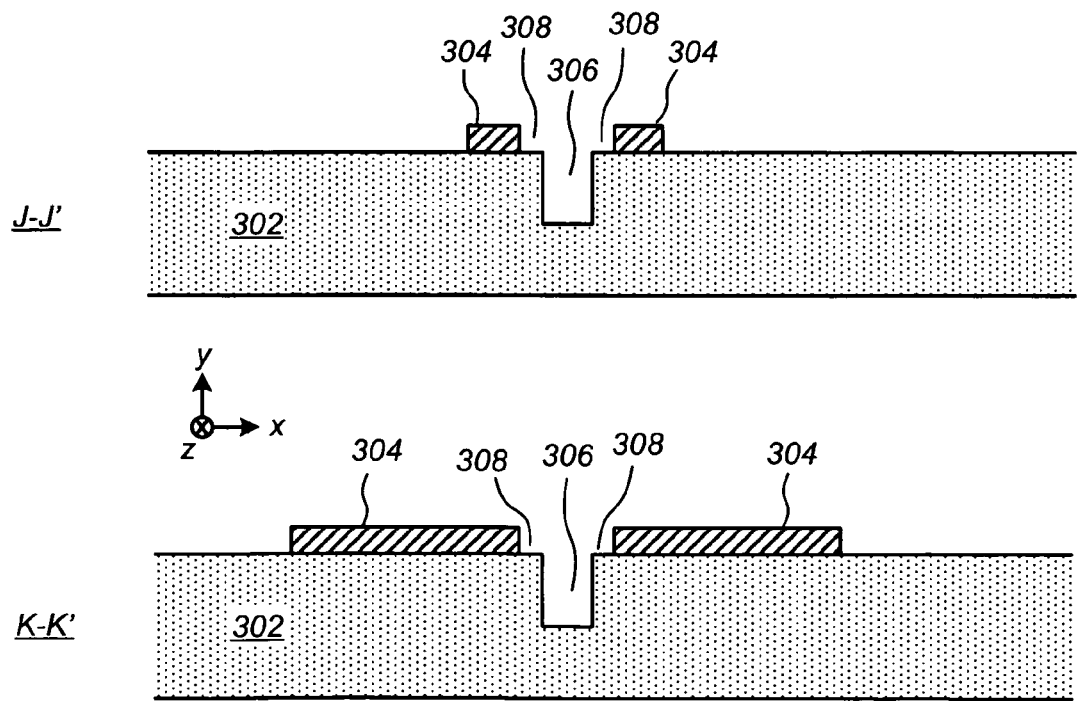
FIG. 3B illustrates side cut-away views corresponding to the portion of the wafer of FIG. 3A.

With respect to FIGS. 3A-3B, the wing-like profile of the selective area growth mask 304 results in a smaller percentage of adjacent substrate coverage nearer to the upper section 310 (see cross-section J-J') and a larger percentage of adjacent substrate coverage nearer to the lower section 314 (see cross-section K-K'). Accordingly, the material layers grow thinner near the upper section 310 and thicker near the lower section 314.

Figure 4A:
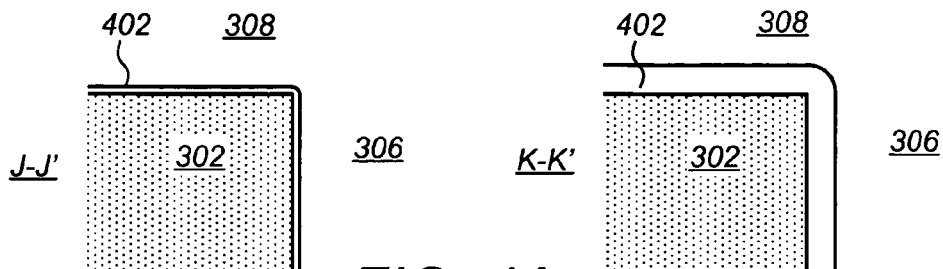
FIGS. 4A-4C illustrate close-up cut-away views near a trench during fabrication of a nanoimprint lithography mold according to an embodiment.
Figure 4B:
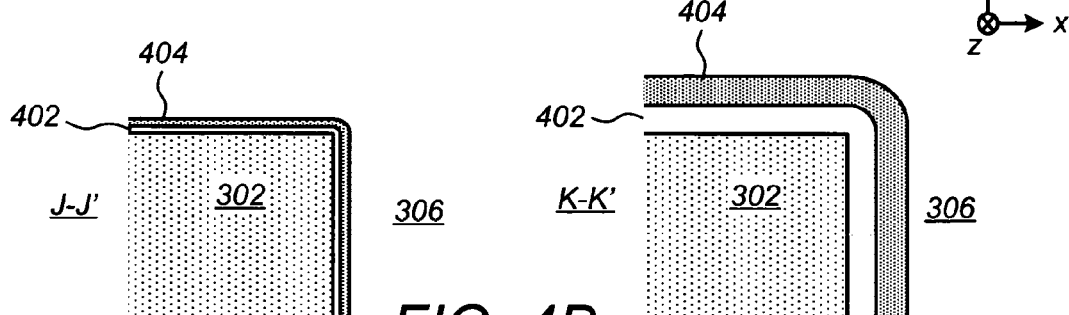
Figure 4C:
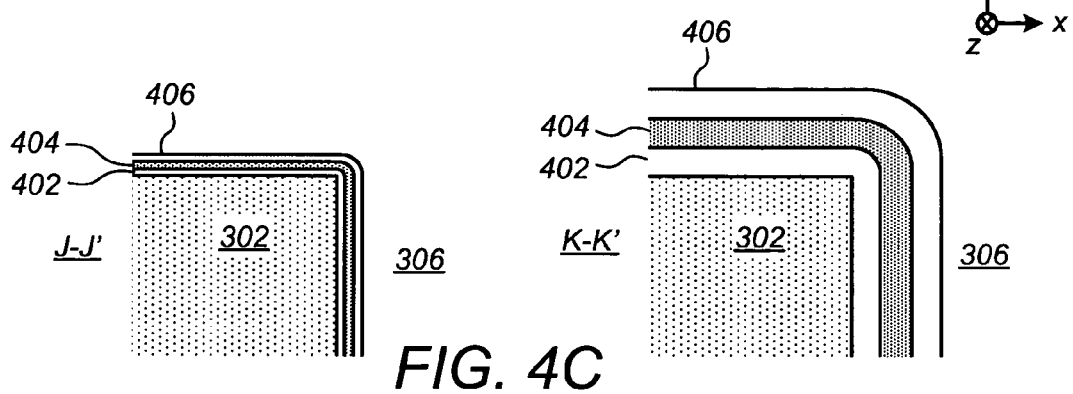

FIGS. 4A-4C illustrate a close-up cross-section near an upper corner of the trench 306 as respective layers 402, 404, and 406 are grown according to a selective area growth process (step 206, supra) according to an embodiment. As illustrated, the layers are thicker at the cross-section K-K' and thinner at the cross-section J-J'. As described supra, there can be a few layers up to thousands of layers without departing from the scope of the present teachings.

Figure 5:
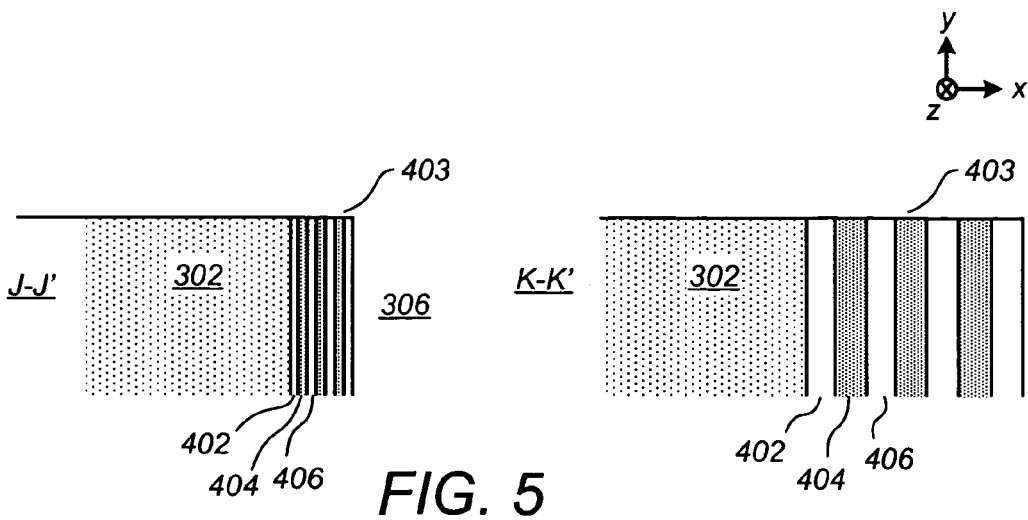
FIG. 5 illustrates the close-up view of FIGS. 4A-4C subsequent to planarization.

FIG. 5 illustrates a close-up cross-section near an upper corner of the trench 306 subsequent to the planarization step 208, supra, which can comprise application of a sacrificial material in the remaining trench volume, chemical-mechanical polishing (CMP), and removal of the sacrificial material. Advantageously, an edge 403 of the stack of alternating material layers is exposed without requiring a cleaving step, with a much easier planarization process being used that is consistent with formation of many copies of the mold 102 on a single substrate wafer.

Figure 6:
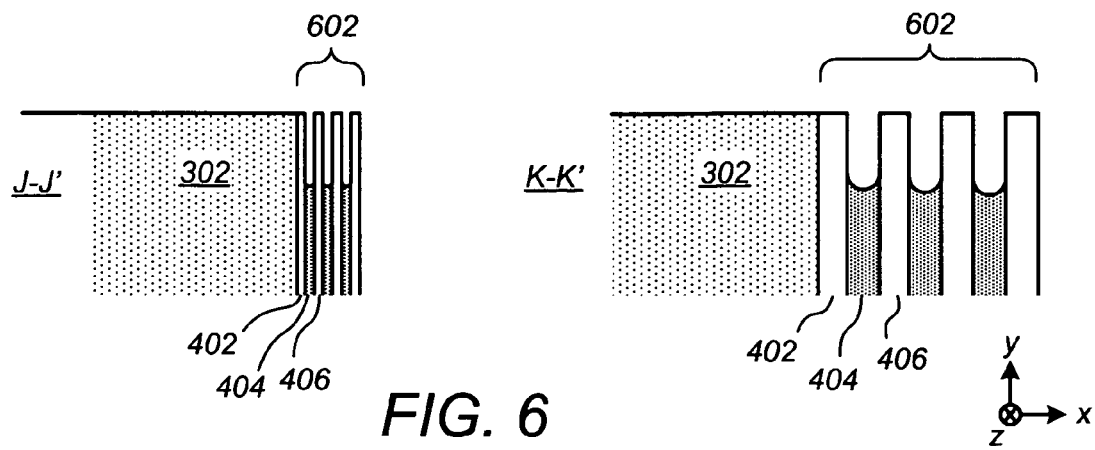
FIG. 6 illustrates the close-up view of FIGS. 4A-4C subsequent to differential etching.

FIG. 6 illustrates a close-up cross-section near an upper corner of the trench 306 subsequent to the differential etching step 210, supra. The desired nanoimprint mold 602 is thereby formed. Any of a variety of techniques may be used to cause the level of the substrate 302 to be above, at the same level, or below the top surface of the nanoimprint mold 602.

Figure 7:
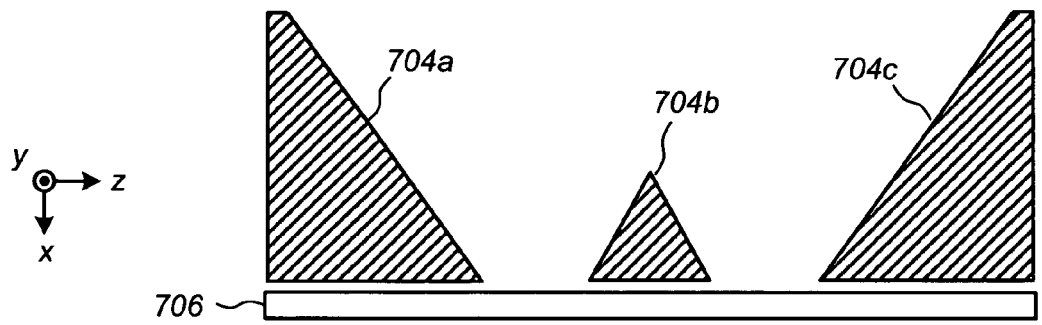
FIG. 7 illustrates a top view of a trench and a selective area growth mask according to an embodiment.

FIG. 7 illustrates a top view of a trench 706 and selective area growth masks 704a, 704b, and 704c at a stage of fabrication similar to that of FIG. 3A, supra, according to an embodiment. The embodiment of FIG. 7 represents an alternative in which the selective area growth masks are only placed on one side of the trench, which spatially controls the layer thicknesses on the proximal side of the trench 706. The side of the trench opposite the selective area growth masks can represent "don't care" material layers that are not used in the final mold wafer. Also, as illustrated in FIG. 7, in some embodiments each nanoline can be a two-port item accessed from both ends rather than a single-port item accessed from one end.

Figure 8:
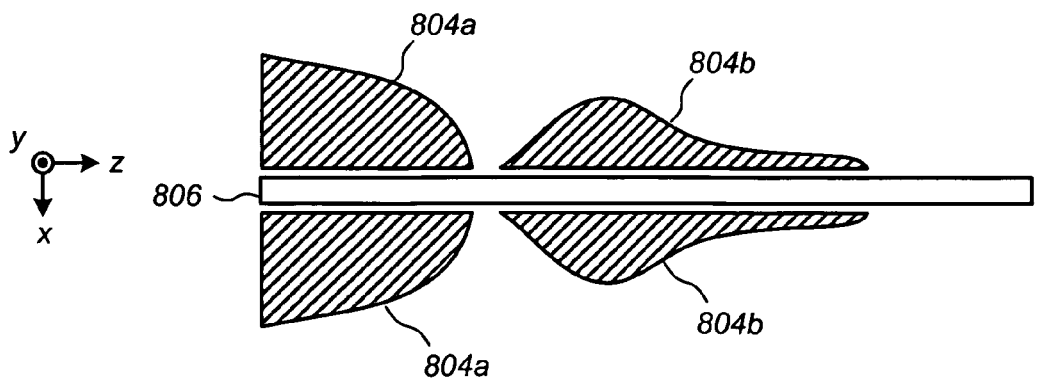
FIG. 8 illustrates a top view of a trench and a selective area growth mask according to an embodiment.

FIG. 8 illustrates a top view of a trench 806 and selective area growth masks 804a and 804b at a fabrication state similar to that of FIG. 7 according to an embodiment. As illustrated, the contours of the selective area growth masks can be curvilinear for any of a variety of reasons, such as for ensuring linear thickness variations in the material layers in the event there is a nonlinear selective area growth relationship between mask coverage and layer thickness. Other possibilities for curvilinear selective area growth masks is for carefully contouring line widths for any of a variety of purposes, such as for achieving particular electromagnetic profiles, avoiding race conditions among different circuits, etc.

Whereas many alterations and modifications of the embodiments will no doubt become apparent to a person of ordinary skill in the art after having read the foregoing description, it is to be understood that the particular embodiments shown and described by way of illustration are in no way intended to be considered limiting. By way of example, although illustrated in FIG. 1 as having a pitch that increases linearly with distance from the narrow end, in other embodiments the pitch can increase as a nonlinear function of distance from the narrow end, as determined by the particular contours of the selective area growth mask and other conditions of the selective area growth process.

By way of further example, references to nanoimprint molds herein can refer interchangeably to molds used in the en masse fabrication of nanoelectronic devices and/or to primary molds used to form secondary molds that are, in turn, used in the en masse fabrication of nanoelectronic devices. Thus, for example, a secondary mold formed by patterning of a soft material with a primary mold formed according to the present teachings, the soft material then being cured or otherwise processed into a hard material for en masse fabrication of nanoelectronic devices, is also within the scope of the present teachings.

By way of still further example, although one or more embodiments supra are described as involving linear trenches that are particularly suitable for facilitating epitaxial growth of the alternating material layers, such linear trenches generally yielding nanoline arrays extending in a single linear direction, it is within the scope of the present teachings to use bent and/or curvilinear trenches for yielding bent and/or curvilinear nanoline arrays, with processes such as plasma-enhanced chemical vapor deposition being used to form the alternating material layers. By way of still further example, one or more of the embodiments may be used in conjunction with the nanoscale patterning described in U.S. Pat. No. 6,407,443, which is incorporated by reference herein.

By way of even further example, although the present teachings are particularly advantageous for the production of metallic nanolines, the fabricated nanolines may alternatively comprise semiconductor material, dielectric material, or other materials without departing from the scope of the present teachings, provided only that the formation of such materials into nanolines can be achieved using nanoimprint lithography. By way of still further example, while one or more embodiments supra are particularly advantageous because a cleaving step is not required, and rather a much easier chemical-mechanical polish is used, in other embodiments there can be different configurations and orientations such that a cleaving step is indeed used to expose an edge of the stack of material layers without departing from the scope of the present teachings. By way of still further example, the material layers 104/106 supra can alternatively comprise Si and an Si—Ge alloy grown on a silicon substrate. Thus, reference to the details of the described embodiments are not intended to limit their scope.

What is claimed is:

1. A nanoimprint mold comprising a plurality of alternating layers of distinct materials differentially etched along an edge thereof, said layers having spatially varying thicknesses along said edge such that nanolines patterned with said nanoimprint mold have corresponding spatially varying pitches, said edge having a length dimension corresponding to a length dimension of the patterned nanolines, said thicknesses of said layers varying gradually in accordance with a lengthwise-varying dimension of a selective area growth mask positioned near said edge during an epitaxial growth of said layers.

2. The nanoimprint mold of claim 1, said layers comprising a first III-V material and a second III-V material having different etch rates for at least one etchant, said selective area growth mask comprising a dielectric material, said lengthwise-varying dimension of said selective area growth mask being a width dimension as measured along a perpendicular to said edge.

3. The nanoimprint mold of claim 1, each layer being less than about 10 nm thick at a first location along said edge, each layer being greater than about 15 nm thick at a second location along said edge.

4. The nanoimprint mold of claim 3, wherein said first and second locations along said edge are separated by at least about 1 μm.

5. The nanoimprint mold of claim 4, each layer being between 1 nm-10 nm thick at said first location.

6. The nanoimprint mold of claim 5, each layer having a constant thickness between said first location and a third location along said edge opposite said second location, said third location being separated from said first location by at least about 0.5 μm.

7. The nanoimprint mold of claim 3, said nanoimprint mold being formed on a wafer, said plurality of alternating layers being epitaxially grown outward from a side of a trench formed in the wafer, wherein said edge of said plurality of alternating layers forms an imprinting surface substantially parallel to a top surface of the wafer.

8. The nanoimprint mold of claim 7, further comprising at least one imprint pattern formed into said top surface of said wafer beyond said second location, wherein said at least one imprint pattern is formed using an electron beam lithography process.

9. The nanoimprint mold of claim 1, wherein said plurality of alternating layers ranges from a few layers of said distinct materials to several thousand layers of said distinct materials.

10. The nanoimprint mold of claim 1 wherein, at any particular point along said edge, all layers of one of said distinct materials have a first uniform thickness and all layers of the other material have a second uniform thickness, which may or may not be the same as said first uniform thickness.

11. The nanoimprint mold of claim 1 wherein, at any particular point along said edge, all layers of each of said distinct materials have different thicknesses with respect to each other.

12. A circuit comprising nanolines formed at least in part using the nanoimprint mold of claim 1.

13. An apparatus comprising an array of nanolines having a first pitch greater than about 30 nm at a first end gradually tapering to a second pitch less than about 20 nm at a second end, said array being fabricated using a nanoimprint mold comprising alternating layers of differentially etched materials, wherein said alternating layers of said nanoimprint mold are epitaxially grown in a vicinity of a selective area growth mask having at least one property that varies with distance along a length of said nanoimprint mold.

14. The apparatus of claim 13, wherein said second pitch is between about 1 nm-10 nm, and wherein said first and second ends are separated by a distance greater than about 1 μm.

15. The apparatus of claim 14, said array comprising between a few nanolines to thousands of nanolines, said nanoimprint mold comprising one pair of said alternating layers corresponding to each of said nanolines.

* * * * *